United States Patent [19]

Mochiji et al.

[11] Patent Number: 4,954,424
[45] Date of Patent: Sep. 4, 1990

[54] PATTERN FABRICATION BY RADIATION-INDUCED GRAFT COPOLYMERIZATION

[75] Inventors: Kozo Mochiji, Hachioji; Hiroaki Oizumi, Kokubunji; Yasunari Soda, Koganei; Taro Ogawa, Kodaira; Takeshi Kimura, Higashimurayama, all of Japan

[73] Assignee: Hitachi, Ltd., Tokyo, Japan

[21] Appl. No.: 295,209

[22] PCT Filed: Jul. 11, 1988

[86] PCT No.: PCT/JP88/00691
§ 371 Date: Dec. 20, 1988
§ 102(e) Date: Dec. 20, 1988

[87] PCT Pub. No.: WO89/01187
PCT Pub. Date: Feb. 9, 1989

[30] Foreign Application Priority Data
Jul. 27, 1987 [JP] Japan .............................. 62-185480

[51] Int. Cl.$^5$ .............................................. G03C 5/16
[52] U.S. Cl. ..................................... 430/323; 430/296; 430/325; 430/967
[58] Field of Search ................ 430/325, 326, 327, 967, 430/323, 296

[56] References Cited

U.S. PATENT DOCUMENTS
4,596,761  6/1986  Brault ................................. 430/296

FOREIGN PATENT DOCUMENTS
295457  12/1988  European Pat. Off. ............ 430/325

OTHER PUBLICATIONS

Liu et al., "Polymethyl Methaesylate Resist Sensitivity Enhancement in X-Ray Lithegraphy...", Appl. Phys. Lett., 44(10), May 15, 1984, pp. 973-975.

Harada, "Dry Etching Durability of Positive Electron Resist", J. Appl. Polymer Sci., vol. 26, 3395-3408, (1981).

*Primary Examiner*—Jose Dees
*Attorney, Agent, or Firm*—Antonelli, Terry, Stout & Kraus

[57] ABSTRACT

The present invention provides a method of pattern fabrication by radiation-induced graft copolymerization which enables not only the fabrication of a very fine resist pattern in a very small exposure dosage but also excellent etching fabrication by utilizing the current dry etching process through the pattern fabrication by making use of a resist capable of causing radiation-induced graft copolymerization and having excellent dry etching resistance, i.e., a poly(methacrylate) having a phenyl group, polystyrene, or its derivative.

13 Claims, 3 Drawing Sheets

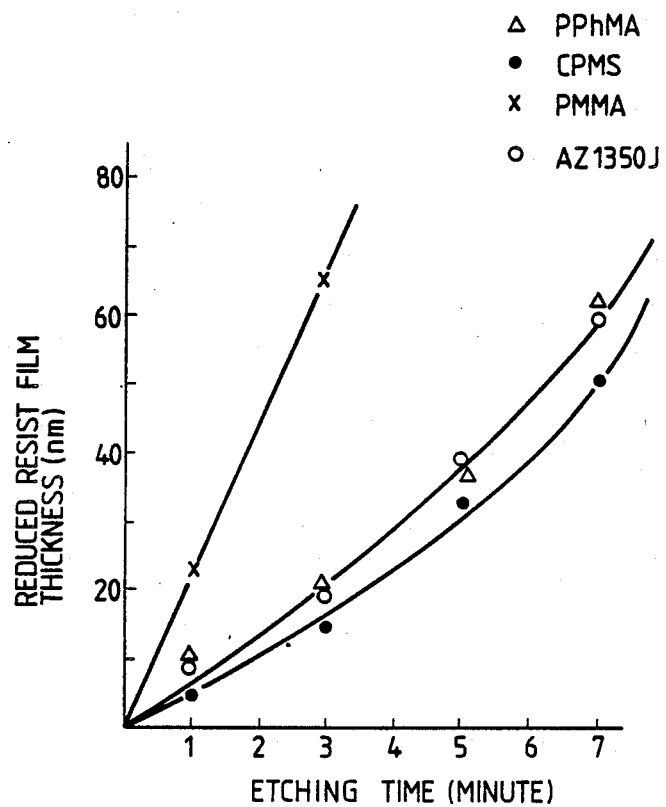

PATTERN FABRICATION BY RADIATION-INDUCED GRAFT COPOLYMERIZATION

TECHNICAL FIELD

The present invention relates to pattern fabrication by radiation-induced graft copolymerization employed in the processing of semiconductor devices etc. and particularly to a resist having excellent dry etching durability.

BACKGROUND ART

In the processing of ULSI etc., studies on pattern fabrication by radiation-induced graft copolymerization using radiation, such as X-ray, are in progress. This pattern fabrication typically comprises an exposure step of irradiating a predetermined region of a resist layer formed on a wafer through coating with radiation, a graft copolymerization step of introducing a monomer to graft-copolymerize the resist layer with the monomer, a development step of eveloping the resist layer to fabricate a predetermined resist pattern, and an etching step of etching the surface of the wafer by making use of the resist pattern as a mask. The feature of the above-described pattern fabrication resides in that the resist can sufficiently be exposed even when the exposure dosage to the resist is small, i.e., an enhancement in the sensitivity of the resist can substantially be attained. This feature enables the pattern fabrication process to be expedited, which makes it possible to attain high throughput.

Conventional pattern fabrication by radiation-induced graft copolymerization is described in, for example, Japanese Pat. Laid-Open No. 137671/1978 (corresponding to U.S. Pat. No. 4195108). In this literature, an example wherein poly(methyl methacrylate) (PMMA) is used as a resist is described. This resist is widely employed as a model resist in the field of lithography.

However, the above-described PMMA resist has a drawback that when the surface of the substrate is dry-etched by making use of the fabricated resist pattern as the mask, the mask per se is etched, i.e., the dry etching resistance is low. Therefore, an improvement in the dry etching resistance of the resist has been desired in order to put pattern fabrication by radiation-induced graft copolymerization to practical use.

DISCLOSURE OF INVENTION

An object of the present invention is to provide pattern fabrication by radiation-induced graft copolymerization which enables an improvement in the dry etching resistance.

In order to attain the above-described object, the resist according to the present invention is made of a resist material capable of causing radiation-induced graft copolymerization and having excellent dry etching resistance, i.e., poly(methacrylate) containing a phenyl group, polystyrene or its derivatives.

As with polystyrene, poly(methacrylate) containing a phenyl group, such as poly(phenyl methacrylate) or poly(benzyl methacrylate), has excellent dry etching resistance, so that the current dry etching process can be employed as it is. Further, since these polymers generate radicals having a long life by irradiation, it is possible to conduct copolymerization with a monomer through graft copolymerization.

Therefore, the present invention enables not only the formation of a fine pattern of a resist in a very small exposure dosage but also excellent etching fabrication through the use of the current dry etching process, which greatly contributes to an improvement in the reliability.

BRIEF DESCRIPTION OF DRAWINGS

FIG. 3 is a graph showing the dry etching resistance of a typical resist.

BEST MODE FOR CARRYING OUT THE INVENTION

Example 1

Figure 1A:
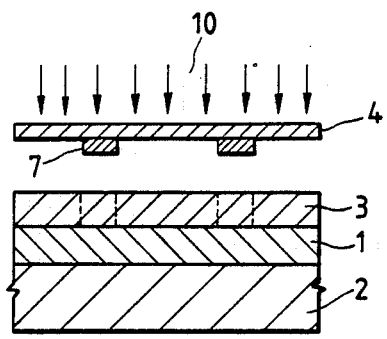
FIGS. 1A to 1E are each a schematic flow diagram illustrating Example 1 according to the present invention.
Figure 1B:
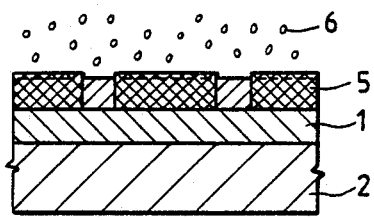
Figure 1C:
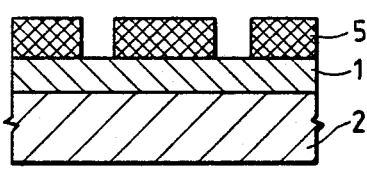

FIGS. 1A to 1E are each a schematic flow diagram illustrating Example 1. A Si wafer 2 having a silicon oxide film 1 containing phosphor deposited on the whole surface thereof is coated with poly(phenyl methacrylate) (PPhMA) to form a resist 3 having a thickness of 1 μm. The resist was exposed to an X-ray 10 in a nitrogen atmosphere containing air in an amount reduced to 1% or less through an X-ray mask 4 having a predetermined circuit pattern 7 (see FIG. 1A). The X-ray 10 was emitted from an electron-bombardment type source with a molybdenum target (not shown) and had a dominant wavelength of 0.54 nm, and the exposure dosage was about 10 mJ/cm$^2$. After the completion of the exposure, the sample 2 was transferred to a reactor (not shown) evacuated to 1 Pa or less, followed by a reaction with vapor of an acrylic acid monomer 6 introduced into the reactor for 5 min, thereby forming a graft copolymer 5 (see FIG. 1B). The reaction temperature was 25±0.5° C. The sample 2 was then immersed in a developer (2-methoxyethyl acetate) for 30 sec (at 25±0.5° C) and then dried to prepare a negative resist pattern 5' (see FIG. 1C).

Figure 1D:
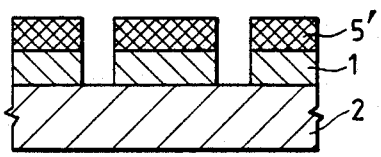
Figure 1E:
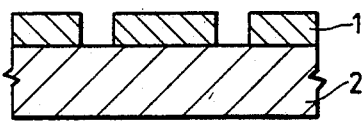
Figure 2A:
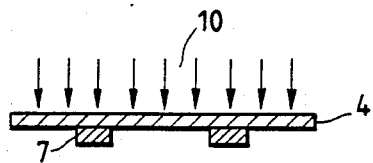
FIGS. 2A to 2E are each a schematic flow diagram illustrating Example 2 according to the present invention.
Figure 2B:
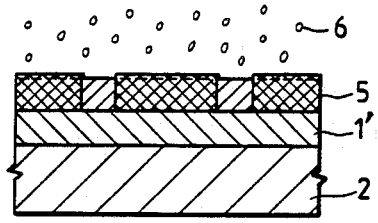
Figure 2C:
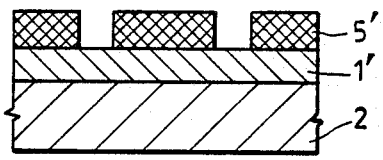
Figure 2D:
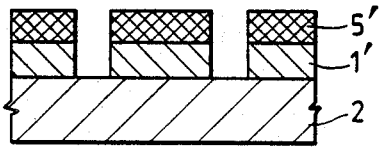
Figure 2E:
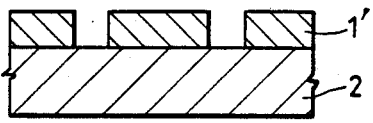

The silicon oxide film 1 of the substrate was subjected to dry etching by making use of the above-fabricated resist pattern 5' as a mask (see FIG. 1D). The dry etching was conducted by making use of parallel type dry-etching equipment and a reactant gas comprising CF$_4$ (67Pa) at a rf power of 100 W. Excellent dry etching of the silicon oxide film 1 could be attained. Then, the resist pattern 5' was removed (see FIG. 1E).

Example 2

FIGS. 2A to 2E are each a schematic flow diagram illustrating Example 2. A Si wafer 2 having an aluminum film 1' deposited on the whole surface thereof is coated with chlorinated polymethylstyrene (CPMS) to form a resist 3' having a thickness of 1.5 μm. The resist 3' was exposed to an X-ray 10 in the same manner as that of Example 1 (see FIG. 2A). However, in this case, the exposure dosage of the X-ray 10 was 5 mJ/cm$^2$. Then, graft copolymerization with an acrylic acid monomer 6 (see FIG. 2B) and development (see FIG. 2C) were conducted in the same manner as that of Example 1, thereby fabricating a resist pattern 5'. Thereafter, the aluminum film 1' of the substrate was subjected to dry etching by making use of the above-fabricated resist pattern 5' as a mask (see FIG. 2D). The dry etching was conducted by making use of reactive ion etching equipment and a reactant gas comprising $BCl_3$ (50Pa) at a rf power of 200 W. Excellent dry etching of the aluminum film 1' could be attained. Then, the resist pattern 5' was removed (see FIG. 2E).

FIG. 3 is a thickness loss curve with respect to the etching (silicon oxide film) of the resists used in the two above-described Examples. It is apparent from the results that the dry etching resistance of these resists is on the level of photoresist AZ1350J.

For comparison, a thickness loss curve with respect to a PMMA resist for graft copolymerization employed in the conventional process is also shown in FIG. 3.

In the two above-described Examples, PPhMA and CPMS were used as the resist. Besides these compounds, the resist may be made of a poly(methacrylate) having a phenyl group, such as poly(benzyl methacrylate), poly(2-phenylethyl methacrylate), poly(benzhydroxy methacrylate), poly(bromophenyl methacrylate), polystyrene, or its derivative such as poly(chloromethylstyrene). With respect to the monomer, besides the above-described acrylic acid, an aqueous solution of acrylic acid, methacrylic acid and an aqueous solution thereof, methyl methacrylate, methyl acrylate, etc. may also be used. The temperature of the graft copolymerization of the resist material with the monomer may be 15 to 100° C. Further, besides the above-described X-ray, an electron beam, an ultraviolet ray, etc. may be used as the radiation. When an electron beam is used, it is possible to conduct the exposure of a predetermined region without use of any mask.

We claim:

1. A method of pattern fabrication by radiation induced graft copolymerization comprising a coating step of forming, on the surface of a substrate to be fabricated, a resist layer composed of a poly(methacrylate) having a phenyl group and which is capable of graft-copolymerization, an exposure step of irradiating a predetermined region of said resist layer with radiation, a graft copolymerization step of introducing a monomer to graft-copolymerize said resist layer with said monomer, a development step of developing said resist layer to fabricate a predetermined resist pattern, and an etching step of conducting dry etching of the surface of said substrate by making use of said resist pattern as a mask.

2. A method of pattern fabrication by radiation-induced graft copolymerization according to claim 1, wherein said poly(methacrylate) having a phenyl group is poly(phenyl methacrylate) or poly(benzyl methacrylate).

3. A method of pattern fabrication by radiation-induced graft copolymerization according to claim 1, wherein said monomer is selected from the group consisting of acrylic acid, an aqueous solution of acyrlic acid, methacrylic acid, an aqueous solution of methacrylic acid, methyl methacrylate, and methyl acrylate.

4. A method of pattern fabrication by radiation-induced graft copolymerization according to claim 1, wherein said graft copolymerization step is conducted at a temperature of 15 to 100° C.

5. A method of pattern fabrication by radiation-induced graft copolymerization according to claim 1, wherein said development step is conducted by making use of a developer composed of 2-methoxyethyl acetate.

6. A method of pattern fabrication by radiation-induced graft copolymerization according to claim 1, wherein said exposure step is conducted by irradiating said resist layer with said radiation through a mask having a predetermined pattern.

7. A method of pattern fabrication by radiation-induced graft copolymerization according to claim 1, wherein said radiation is an X-ray.

8. A method of pattern fabrication by radiation-induced graft copolymerization according to claim 1, wherein said poly(methacrylate) having a phenyl group is selected from the group consisting of poly(phenyl methacrylate), poly(benzyl methacrylate), poly(2-phenylethyl methacrylate), poly(benzhydroxy methacrylate) and poly(bromophenyl methacrylate).

9. A method of pattern fabrication by radiation-induced graft copolymerization according to claim 1, wherein said poly(methacrylate) having a phenyl group is poly(phenyl methacrylate).

10. A method of pattern fabrication by radiation-induced graft copolymerization according to claim 1, wherein said poly(methacrylat) having a phenyl group is poly(benzyl methacrylate).

11. A method of pattern fabrication by radiation-induced graft copolymerization according to claim 1, wherein said poly(methacrylate) having a phenyl group is poly(2- phenylethyl 12. A method of pattern fabrication by radiation-induced graft copolymerization according to claim 1, wherein said poly(methacryate) having a phenyl group is poly(benzhydroxy methacrylate).

13. A method of pattern fabrication by radiation-induced copolymerization according to claim 1, wherein said poly(methacrylate) having a phenyl group is poly(bromophenyl methacrylate).

* * * * *